(12) United States Patent
Sakurai et al.

(10) Patent No.: US 9,982,335 B2
(45) Date of Patent: May 29, 2018

(54) MANUFACTURING METHOD OF CYLINDRICAL SPUTTERING TARGET MATERIAL

(71) Applicant: MITSUBISHI MATERIALS CORPORATION, Tokyo (JP)

(72) Inventors: Akira Sakurai, Osaka (JP); Satoshi Kumagai, Osaka (JP); Takashi Sonohata, Iwaki (JP); Michiaki Ohto, Osaka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 5 days.

(21) Appl. No.: 14/911,236

(22) PCT Filed: Feb. 20, 2015

(86) PCT No.: PCT/JP2015/054788
§ 371 (c)(1),
(2) Date: Feb. 9, 2016

(87) PCT Pub. No.: WO2015/156040
PCT Pub. Date: Oct. 15, 2015

(65) Prior Publication Data
US 2016/0194749 A1    Jul. 7, 2016

(30) Foreign Application Priority Data

Apr. 11, 2014  (JP) .................... 2014-081702

(51) Int. Cl.
*C22C 9/00*      (2006.01)
*C22F 1/08*      (2006.01)
(Continued)

(52) U.S. Cl.
CPC ............ *C23C 14/3414* (2013.01); *C21D 8/10* (2013.01); *C21D 9/0068* (2013.01); *C22C 9/00* (2013.01);
(Continued)

(58) Field of Classification Search
CPC . A01B 12/006; B22D 11/004; C23C 14/3414; C23C 14/3407; C22C 9/00;
(Continued)

(56) References Cited

U.S. PATENT DOCUMENTS 2,365,208 A * 12/1944 Morris .................... B21C 37/30
148/554
4,110,132 A    8/1978 Parikh et al.
(Continued)

FOREIGN PATENT DOCUMENTS

CN    101619444 A    1/2010
CN    102102182 A    6/2011
(Continued)

OTHER PUBLICATIONS

Office Action dated Mar. 2, 2016 for the corresponding Korean Patent Application No. 10-2016-7000741.
(Continued)

*Primary Examiner* — Keith Walker
*Assistant Examiner* — John A Hevey
(74) *Attorney, Agent, or Firm* — Leason Ellis LLP

(57) ABSTRACT

A manufacturing method of a cylindrical sputtering target material formed of copper or a copper alloy is provided, the method including: a continuous casting step of casting a cylindrical ingot having an average crystal grain diameter equal to or smaller than 20 mm using a continuous casting machine or a semi-continuous casting machine; and a cold working step and a heat treatment step of repeatedly performing cold working and a heat treatment with respect to
(Continued)

the cylindrical ingot, to form the cylindrical sputtering target material in which an average crystal grain diameter of an outer peripheral surface is from 10 µm to 150 µm and a proportion of the area of crystal grains having a crystal grain diameter more than double the average crystal grain diameter is less than 25% of the entire crystal area.

5 Claims, 2 Drawing Sheets

(51) Int. Cl.
| | |
|---|---|
| C22F 1/00 | (2006.01) |
| C21D 8/10 | (2006.01) |
| H01J 37/34 | (2006.01) |
| B22D 11/00 | (2006.01) |
| C22C 9/01 | (2006.01) |
| C22C 9/02 | (2006.01) |
| C22C 9/04 | (2006.01) |
| C22C 9/05 | (2006.01) |
| C22C 9/06 | (2006.01) |
| C23C 14/34 | (2006.01) |
| C21D 9/00 | (2006.01) |

(52) U.S. Cl.
CPC ............... *C22C 9/05* (2013.01); *C22F 1/00* (2013.01); *C22F 1/08* (2013.01); *C23C 14/3407* (2013.01); *H01J 37/3423* (2013.01); *H01J 37/3426* (2013.01); *H01J 37/3491* (2013.01); *B22D 11/004* (2013.01); *C22C 9/01* (2013.01); *C22C 9/02* (2013.01); *C22C 9/04* (2013.01); *C22C 9/06* (2013.01)

(58) Field of Classification Search
CPC .... C22C 9/01; C22C 9/02; C22C 9/04; C22C 9/05; C22C 9/06; C22F 1/08; C22F 1/00; H01J 37/3423; H01J 37/3426; H01J 37/3491; C21D 9/0068; C21D 8/10
See application file for complete search history.

(56) References Cited

U.S. PATENT DOCUMENTS

| | | | | |
|---|---|---|---|---|
| 5,590,389 | A | * | 12/1996 | Dunlop ................. B21C 23/001 419/66 |
| 2003/0052000 | A1 | | 3/2003 | Segal et al. |
| 2004/0144643 | A1 | | 7/2004 | Wu et al. |
| 2007/0209741 | A1 | * | 9/2007 | Carpenter ............. B21B 1/0805 148/668 |
| 2010/0059147 | A9 | | 3/2010 | Segal et al. |
| 2010/0101948 | A1 | * | 4/2010 | Lippert ............... C23C 14/3407 204/298.28 |
| 2011/0139615 | A1 | * | 6/2011 | Tatsumi .................... C22C 9/00 204/298.13 |
| 2014/0001039 | A1 | | 1/2014 | Tamura et al. |
| 2016/0056025 | A1 | * | 2/2016 | Kato .................... B22D 11/006 204/298.13 |

FOREIGN PATENT DOCUMENTS

| | | |
|---|---|---|
| CN | 102206770 A | 10/2011 |
| CN | 102994962 A | 3/2013 |
| CN | 103225066 A | 7/2013 |
| CN | 103502505 A | 1/2014 |
| JP | 05-311424 A | 11/1993 |
| JP | 2012-111994 A | 6/2012 |
| JP | 4974198 B | 7/2012 |
| JP | 2013-076129 A | 4/2013 |
| KR | 10-2013-0094352 | 8/2013 |
| WO | WO-2009/123059 A | 10/2009 |
| WO | WO-2013/031381 A | 3/2013 |
| WO | WO-2014/030362 A | 2/2014 |

OTHER PUBLICATIONS

International Search Report dated May 19, 2015 for the corresponding PCT Application No. PCT/JP2015/054788.
Office Action dated Jan. 25, 2016 for the corresponding Taiwanese Patent Application No. 104105829.
Office Action dated Oct. 9, 2016 for the corresponding Chinese Patent Application No. 201580001520.7.
Office Action dated May 24, 2016 for the related German Patent Application No. 112015000124.7.
Office Action dated Jul. 11, 2016 for the corresponding Chinese Patent Application No. 201580001520.7.

* cited by examiner

MANUFACTURING METHOD OF CYLINDRICAL SPUTTERING TARGET MATERIAL

CROSS-REFERENCE TO RELATED PATENT APPLICATIONS

This application is a U.S. National Phase Application under 35 U.S.C. § 371 of International Patent Application No. PCT/JP2015/054788, filed Feb. 20, 2015, and claims the benefit of Japanese Patent Application No. 2014-081702, filed Apr. 11, 2014, all of which are incorporated by reference in their entireties herein. The International Application was published in Japanese on Oct. 15, 2015 as International Publication No. WO/2015/156040 under PCT Article 21(2).

FIELD OF THE INVENTION

The present invention relates to a manufacturing method of a cylindrical sputtering target material which is a material for a cylindrical sputtering target used for sputtering of a thin film formed of copper or a copper alloy.

BACKGROUND OF THE INVENTION

In the related art, Al or an Al alloy is widely used as a wiring film such as a flat panel display including a liquid crystal and an organic EL panel, or a touch panel. In recent years, it has been required that the wiring film be miniaturized (has a narrow width) and have a small thickness, and a wiring film having a lower specific resistance than the wiring film in the related art is desired.

Therefore, a wiring film using copper or a copper alloy, which is a material having a lower specific resistance than Al or an Al alloy, is provided in order to meet the demand for miniaturization and a small thickness of the wiring film as described above.

A sputtering method using a sputtering target is generally used when forming such a wiring film (thin film) of copper or a copper alloy on a substrate.

As the sputtering target described above, a flat sputtering target disclosed in Japanese Patent No. 4974198 or a cylindrical sputtering target disclosed in Japanese Unexamined Patent Application, First Publication No. 2012-111994 has been proposed.

Herein, the cylindrical sputtering target has an outer peripheral surface as a sputtering surface and the sputtering is performed while rotating the target. Accordingly, the sputtering using the cylindrical sputtering target is suitable for continuous film formation compared to a case using a flat sputtering target, and excellent efficiency in use of the target is obtained.

As disclosed in Japanese Unexamined Patent Application, First Publication No. 2012-111994, the cylindrical sputtering target described above is manufactured by performing a hot working step (hot rolling step and hot extrusion step), a drawing step, and an annealing step. That is, in the related art, a cylindrical shape is formed by performing working by heating a columnar ingot to a predetermined temperature which is equal to or higher than a recrystallizing temperature, and then a cylindrical sputtering target having a predetermined shape is formed by further performing working and a heat treatment.

Technical Problem

However, in the manufacturing method of a cylindrical sputtering target material disclosed in Japanese Unexamined Patent Application, First Publication No. 2012-111994, since a cylindrical shape is formed by performing hot working (hot rolling and hot extrusion) by heating an ingot to a predetermined temperature which is equal to or higher than a recrystallizing temperature, production efficiency is poor, the amount of energy loss increases, and the manufacturing cost significantly increases.

In addition, in Japanese Unexamined Patent Application, First Publication No. 2012-111994, oxygen-free copper is used as a target, but when a copper alloy to which various elements are added is used as a target, deformation resistance at a high temperature increases according to the composition thereof, and accordingly a cylindrical shape may not be formed by hot working.

The invention is made in consideration of these circumstances and an object thereof is to provide a manufacturing method of a cylindrical sputtering target material which can efficiently manufacture a cylindrical sputtering target material formed of copper or a copper alloy at low cost and uniformly miniaturize crystal grain diameters of an outer peripheral surface.

SUMMARY OF THE INVENTION

Solution to Problem

In order to solve the problems described above, according to an aspect of the invention, a manufacturing method of a cylindrical sputtering target material formed of copper or a copper alloy is provided, the method including: a continuous casting step of continuously casting a cylindrical ingot using a continuous casting machine or a semi-continuous casting machine; and a cold working step and a heat treatment step of repeatedly performing cold working and a heat treatment with respect to the cylindrical ingot to form the cylindrical sputtering target material, in which an average crystal grain diameter of the cylindrical ingot is set to be equal to or smaller than 20 mm in the continuous casting step, and an average crystal grain diameter of an outer peripheral surface of the cylindrical sputtering target material is from 10 μm to 150 μm and a proportion of the area of crystal grains having a crystal grain diameter more than double the average crystal grain diameter is less than 25% of the entire crystal area in the cold working step and the heat treatment step.

According to the manufacturing method of a cylindrical sputtering target material of the invention configured as described above, since the continuous casting step of continuously casting the cylindrical ingot having an average crystal grain diameter equal to or smaller than 20 mm using a continuous casting machine or a semi-continuous casting machine is included, it is possible to omit the hot working step in order to form an ingot in a cylindrical shape. In addition, since the continuous casting is performed, it is possible to obtain a cylindrical ingot having a predetermined length. Accordingly, it is possible to significantly reduce the manufacturing cost of the cylindrical sputtering target. In addition, since a cylindrical shape is not formed by performing hot working with respect to the ingot, it is possible to efficiently manufacture a cylindrical sputtering target, even when a copper alloy having high deformation resistance at a high temperature is a target.

Further, since the average crystal grain diameter of the cylindrical ingot is equal to or smaller than 20 mm, it is possible to form a cylindrical sputtering target material in which an average crystal grain diameter of an outer peripheral surface of a cylindrical sputtering target material to be formed is from 10 μm to 150 μm and a proportion of the area of crystal grains having a crystal grain diameter more than double the average crystal grain diameter is less than 25% of the entire crystal area, by repeatedly performing the cold working and the heat treatment with respect to the cylindrical ingot. In addition, since the outer peripheral surface described above is a sputtering surface, it is possible to manufacture a cylindrical sputtering target in which crystal grain diameters of the sputtering surface are uniformly miniaturized. Further, by setting the average crystal grain diameter of the outer peripheral surface of the cylindrical sputtering target material to be from 10 µm to 150 µm and the proportion of the area of the crystal grains having a crystal grain diameter more than double the average crystal grain diameter to be less than 25% of the entire crystal area, it is possible to decrease the number of times of an abnormal electrical discharge occurring at the time of sputtering.

Herein, in the manufacturing method of a cylindrical sputtering target material according to the aspect of the invention, a tube expansion step of increasing an outer diameter before and after the working in a range exceeding 0% and equal to or smaller than 30% and changing a sectional area after the working to be in a range of −10% to +10% of a sectional area before the working may be performed at least once as the cold working step.

In this case, since the tube expansion step of increasing an outer diameter before and after the working in a range exceeding 0% and equal to or smaller than 30% and changing a sectional area after the working to be in a range of −10% to +10% of a sectional area before the working is included, it is possible to form a cylindrical sputtering target material having a larger diameter than that of the cylindrical ingot obtained in the continuous casting Step. By performing the tube expansion step, it is possible to set high workability of the cold working to obtain more miniaturized crystal grains.

In the manufacturing method of a cylindrical sputtering target material according to the aspect of the invention, a heat treatment temperature may be from 400° C. to 900° C. and the maintaining time in the range of the heat treatment temperature may be in a range of 15 minutes to 120 minutes in the heat treatment step.

In this case, since the heat treatment is performed under the conditions in which the heat treatment temperature is from 400° C. to 900° C. and the maintaining time in the range of the heat treatment temperature is in a range of 15 minutes to 120 minutes, it is possible to reduce working strain generated by the cold working and repeatedly perform the cold working. In addition, in the heat treatment step, it is possible to prevent generation of coarse crystal grains. Therefore, it is possible to reliably manufacture a cylindrical sputtering target material in which crystal grain diameters of an outer peripheral surface are uniformly miniaturized.

Advantageous Effects of Invention

According to the invention, it is possible to provide a manufacturing method of a cylindrical sputtering target material which can efficiently manufacture a cylindrical sputtering target material formed of copper or a copper alloy at low cost and uniformly miniaturize crystal grain diameters of an outer peripheral surface.

DETAILED DESCRIPTION OF THE INVENTION

Hereinafter, a manufacturing method of a cylindrical sputtering target material according to the embodiment of the invention will be described with reference to the accompanied drawings.

A cylindrical sputtering target material 10 as a material of a cylindrical sputtering target used when forming a thin film (wiring film) formed of copper or a copper alloy on a glass substrate or the like by performing sputtering is manufactured by the manufacturing method of a cylindrical sputtering target material according to the embodiment.

<Cylindrical Sputtering Target Material>

Figure 1:
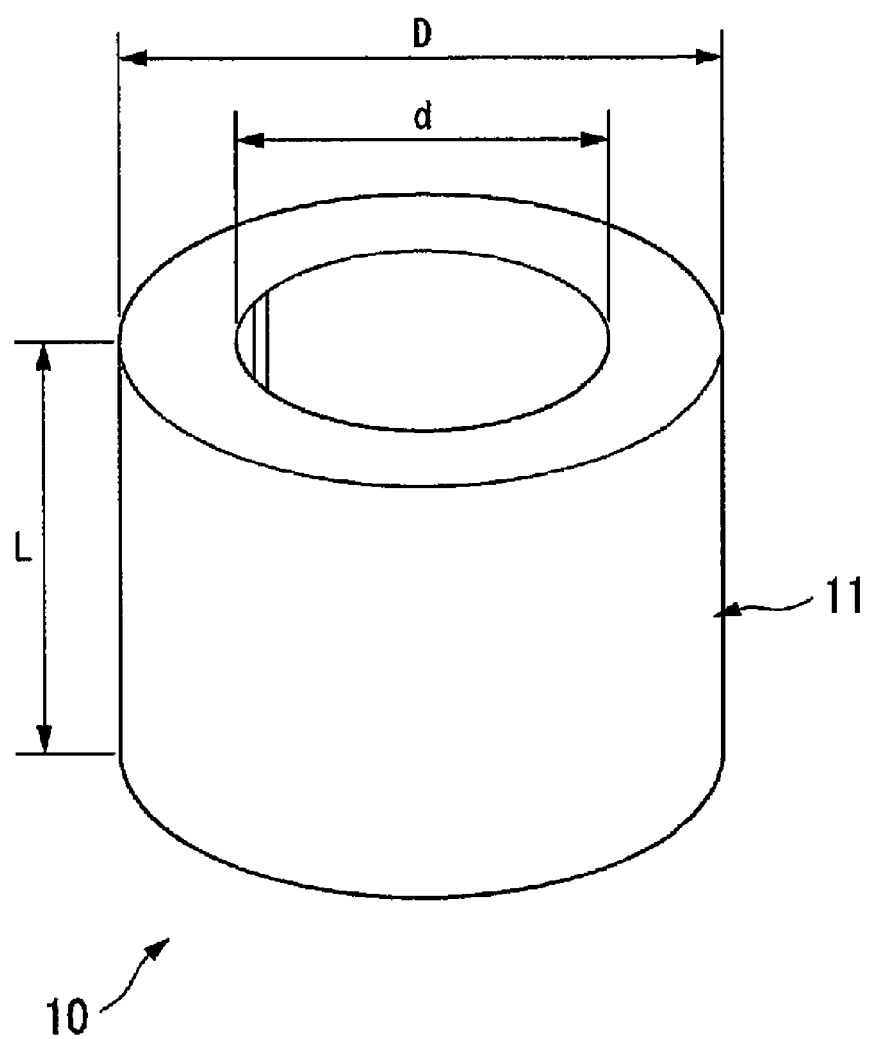
FIG. 1 is a schematic explanatory diagram of a cylindrical sputtering target material which is manufactured by a manufacturing method of a cylindrical sputtering target material according to the embodiment of the invention.
Figure 2:
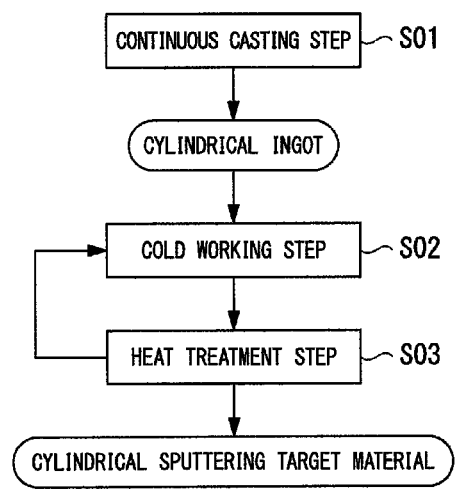
FIG. 2 is a flowchart of a manufacturing method of a cylindrical sputtering target material according to the embodiment of the invention.

As shown in FIG. 1, the cylindrical sputtering target material 10 has a cylindrical shape, an outer diameter D thereof is in a range satisfying a relationship of 140 mm≤D≤180 mm, an inner diameter d thereof is in a range satisfying a relationship of 110 mm≤d≤135 mm, and a length L thereof is in a range satisfying a relationship of 1000 mm≤L≤4000 mm, for example.

Herein, an outer peripheral surface 11 of the cylindrical sputtering target material 10 is a sputtering surface of a cylindrical sputtering target.

The cylindrical sputtering target material 10 is configured with copper or a copper alloy having a composition according to a thin film to be formed of copper or a copper alloy.

The cylindrical sputtering target material 10 of the embodiment is configured with pure copper such as oxygen-free copper, tough pitch copper, or 4N copper, or a copper alloy containing one kind or two or more kinds selected from Mg, Al, Ag, Ti, Zr, Mn, Ca, Cr, Sn, Ni, Zn, Co, and P. Particularly, the total content of one kind or two or more kinds selected from Mg, Al, Ag, Ti, Zr, Mn, Ca, Cr, Sn, Ni, Zn, Co, and P is preferably in a range of 0.001 mass % to 10 mass %.

Various characteristics such as resistivity, heat resistance, corrosion resistance, and the like are required for the thin film described above, and various copper or copper alloys are used. Therefore, in the embodiment, as copper alloys configuring the cylindrical sputtering target material 10, a Cu-0.002 mass % to 2 mass % Mg alloy, a Cu-0.001 mass % to 10 mass % Al alloy, a Cu-0.001 mass % to 10 mass % Mn alloy, a Cu-0.05 mass % to 4 mass % Ca alloy, a Cu-0.01 mass % to 10 mass % Ag alloy, and the like are used, for example.

Herein, in the copper alloy containing various elements described above, deformation resistance (deformation stress) at a high temperature tends to be increased compared to pure copper such as oxygen-free copper, and a copper alloy in which deformation resistance (deformation stress) at 600° C. is equal to or greater than 50 N/mm$^2$ is also included, for example. It is difficult to form such a copper alloy having high deformation resistance at a high temperature in a cylindrical shape by performing hot working with respect to a columnar ingot, for example.

In the cylindrical sputtering target material 10 to be manufactured by the manufacturing method of a cylindrical sputtering target material of the embodiment, an average crystal grain diameter of the outer peripheral surface is from 10 µm to 150 µm and a proportion of the area of crystal grains having a crystal grain diameter more than double the average crystal grain diameter is less than 25%.

Herein, after calculating the average crystal grain diameter, crystal grains having a crystal grain diameter more than double the average crystal grain diameter are specified, the crystal grain diameter thereof is measured and the number thereof is counted, an area of the crystal grains having a crystal grain diameter more than double the average crystal grain diameter is calculated, and crystal grain diameters of all of the observed crystal grains are measured and the number thereof is counted, to calculate the entire area, and accordingly, the proportion of the area of the crystal grains having a crystal grain diameter more than double the average crystal grain diameter is acquired.

<Manufacturing Method of Cylindrical Sputtering Target Material>

In order to manufacture the cylindrical sputtering target material 10 having the configuration described above, the manufacturing method of a cylindrical sputtering target material of the embodiment includes a continuous casting Step S01 of continuously casting a cylindrical ingot using a continuous casting machine or a semi-continuous casting machine, a cold working Step S02 of performing cold working with respect to the cylindrical ingot, and a heat treatment Step S03 of performing a heat treatment for a cylindrical worked material which is subjected to the cold working Step S02. In the embodiment, the cold working Step S02 and the heat treatment Step S03 are repeatedly performed, and in the cold working Step S02, the cold working is performed for the cylindrical ingot and the cylindrical worked material obtained from the cylindrical ingot subjected to the cold working and the heat treatment.

In the continuous casting Step S01, a cylindrical ingot is continuously manufactured using various casting machines such as a vertical continuous casting machine, a horizontal continuous casting machine, and a semi-continuous casting machine, and is cut to have a predetermined length. Herein, in the continuous casting step S01, the casting conditions are set so that an average crystal grain diameter of the obtained cylindrical ingot is equal to or smaller than 20 mm. Specifically, a drawing speed is set so that a cooling speed of the ingot is equal to or higher than 100° C./min by controlling primary cooling and secondary cooling according to the dimensions of the ingot. In a case of using a vertical continuous casting machine, the primary cooling is performed using a graphite mold covered with a water-cooling jacket and the secondary cooling is performed using a water-cooling shower. In a case of using a horizontal continuous casting machine, the cooling is controlled by the amount of cooling water flowing to the graphite mold covered with a water-cooling jacket. In addition, it is preferable that an average crystal grain diameter of the cylindrical ingot be fine, but when the average crystal grain diameter thereof is smaller than 0.01 mm, significant cost is required for production equipment, and accordingly, the average crystal grain diameter of the cylindrical ingot is desirably in a range of 0.01 mm to 20 mm. A lower limit value of the average crystal grain diameter of the cylindrical ingot is more preferably 1 mm, but there is no limitation.

Herein, when the average crystal grain diameter of the cylindrical ingot exceeds 20 mm, even when the cold working Step S02 and the heat treatment Step S03 are repeatedly performed, the average crystal grain diameter of the outer peripheral surface of the cylindrical sputtering target material 10 may not be from 10 µm to 150 µm and the proportion of an area of crystal grains having a crystal grain diameter more than double the average crystal grain diameter may not be less than 25% of the entire crystal area. Accordingly, in the embodiment, the average crystal grain diameter of the cylindrical ingot is set to be equal to or smaller than 20 mm. In order to reliably exhibit the operational effects described above, the average crystal grain diameter of the cylindrical ingot is preferably equal to or smaller than 20 mm and more preferably equal to or smaller than 12 mm.

Regarding the average crystal grain diameter of the cylindrical ingot, it is preferable that a crystal structure of an outer peripheral surface which is a sputtering surface in the cylindrical sputtering target be set as a target. However, when the cylindrical ingot has an isometric crystal structure, a horizontal cross-section of the cylindrical ingot is observed and the average crystal grain diameter thereof may be equal to or smaller than 20 mm. Particularly, a copper alloy to which various elements are added tends to have an isometric crystal structure, and accordingly, the average crystal grain diameter thereof can be measured by observing the structure as described above.

Meanwhile, when the cylindrical ingot has a columnar crystal structure, the average crystal grain diameter of the outer peripheral surface of the cylindrical ingot may be equal to or smaller than 20 mm. Specifically, in the columnar crystal structure in which crystals grow from the outer peripheral surface of the cylindrical ingot towards the inner side in a radial direction, it is preferable that the average crystal grain diameter of the outer peripheral surface of the cylindrical ingot be equal to or smaller than 20 mm. Particularly, since the cylindrical ingot configured with pure copper such as oxygen-free copper tends to have a columnar crystal structure, it is preferable to perform the structure observation as described above.

In the cold working Step S02, cold working is performed for the cylindrical ingot (and the cylindrical worked material obtained from the cylindrical ingot subjected to the cold working and the heat treatment). As a cold working method, various methods such as drawing, cold forging, and tube rolling (rolling performed using a tube reducer) can be used.

Herein, as the cold working step S02, a tube expansion step of increasing an outer diameter of a cylindrical ingot or a cylindrical worked material before the cold working to be in a range exceeding 0% and equal to or smaller than 30% and changing a sectional area after the cold working to be in a range of −10% to +10% of a sectional area before the cold working may be performed at least once.

In the heat treatment Step S03, a heat treatment is performed for the cylindrical worked material which is subjected to the cold working. Heat treatment means are not particularly limited, but a batch type heat treatment furnace or continuous annealing furnace can be used. Herein, in the embodiment, the heat treatment Step S03 is performed using a batch type heat treatment furnace in heat treatment conditions in which a heat treatment temperature is from 400° C. to 900° C. and a maintaining time of the material in a range of the heat treatment temperature is in a range of 15 minutes to 120 minutes.

As described above, in the embodiment, by manufacturing the cylindrical ingot in the continuous casting Step S01 and repeatedly performing the cold working Step S02 and the heat treatment Step S03 with respect to the cylindrical ingot, the cylindrical sputtering target material 10 in which the average crystal grain diameter of the outer peripheral surface is from 10 µm to 150 µm and the proportion of the area of the crystal grains having a crystal grain diameter more than double the average crystal grain diameter is less than 25% of the entire crystal area is formed. The average crystal grain diameter of the outer peripheral surface is preferably from 30 μm to 100 μm, but there is no limitation. A lower limit value of the proportion of the area of the crystal grains having a crystal grain diameter more than double the average crystal grain diameter may be 10% of the entire crystal area. In addition, the proportion of the area of the crystal grains having a crystal grain diameter more than double the average crystal grain diameter is preferably from 10% to 20%, but there is no limitation.

The cylindrical sputtering target material 10 formed as described above is further subjected to working and is used as a cylindrical sputtering target material. Herein, the cylindrical sputtering target is used to be rotated around an axis in a sputtering device and an outer peripheral surface thereof is used as a sputtering surface.

According to the manufacturing method of a cylindrical sputtering target material of the embodiment having the configuration described above, since the method includes the continuous casting Step S01 of continuously casting a cylindrical ingot using a continuous casting machine or a semi-continuous casting machine, it is possible to omit the hot working step for forming an ingot in a cylindrical shape and to significantly decrease the manufacturing cost.

In addition, since it is possible to omit the hot working step, it is possible to efficiently manufacture even a cylindrical sputtering target material formed of a copper alloy having high deformation resistance at a high temperature, specifically a copper alloy in which deformation resistance (deformation stress) at a hot working temperature (600° C. to 900° C.) is equal to or greater than 50 N/mm$^2$.

Herein, in the embodiment, since the average crystal grain diameter of the cylindrical ingot is set to be equal to or smaller than 20 mm, it is possible to form the cylindrical sputtering target material 10 in which the average crystal grain diameter of the outer peripheral surface is from 10 μm to 150 μm and the proportion of the area of the crystal grains having a crystal grain diameter more than double the average crystal grain diameter is less than 25% of the entire crystal area, by repeatedly performing the cold working Step S02 and the heat treatment Step S03.

In addition, it is possible to manufacture a cylindrical sputtering target in which the crystal grain diameters of the sputtering surface are uniformly miniaturized, by using the cylindrical sputtering target material 10 in which the crystal structure is controlled as described above.

Further, in the embodiment, when the tube expansion step of increasing an outer diameter of a cylindrical ingot or a cylindrical worked material before the cold working to be in a range exceeding 0% and equal to or smaller than 30% and changing a sectional area after the working to be in a range of −10% to +10% of a sectional area before the working is performed at least once in the cold working Step S02, it is possible to form the cylindrical sputtering target material 10 having a larger diameter than that of the cylindrical ingot manufactured in the continuous casting Step S01. By performing the tube expansion step, it is possible to ensure workability in the cold working Step S02 and to realize miniaturization of the crystal diameters of the cylindrical sputtering target material 10.

In the embodiment, since the conditions of the heat treatment Step S03 are set so that the heat treatment temperature is from 400° C. to 900° C. and the maintaining time of the material in a range of the heat treatment temperature is in a range of 15 minutes to 120 minutes, it is possible to reduce working strain generated in the cold working Step S02 and to repeatedly perform the cold working Step S02. In addition, in the heat treatment Step S03, it is possible to prevent generation of coarse crystal grains.

In the embodiment, when the cylindrical sputtering target material 10 formed of a copper alloy containing one kind or two or more kinds selected from Mg, Al, Ag, Ti, Zr, Mn, Ca, Cr, Sn, Ni, Zn, Co, and P is manufactured, it is possible to manufacture a crystal sputtering target which can form a thin film having various excellent characteristics such as resistivity, heat resistance, corrosion resistance, and the like. In the copper alloy described above, the total content of one kind or two or more kinds selected from Mg, Al, Ag, Ti, Zr, Mn, Ca, Cr, Sn, Ni, Zn, Co, and P is desirably in a range of 0.001 mass % to 10 mass %.

In the embodiment, when the cylindrical ingot formed of a columnar crystal structure of oxygen-free copper or the like, for example, is manufactured in the continuous casting Step S01, columnar crystals grow from the outer peripheral surface towards the inner side in a radial direction and the average crystal grain diameter of the outer peripheral surface of the cylindrical ingot is equal to or smaller than 20 mm. Accordingly, it is possible to manufacture the cylindrical sputtering target material 10 in which the average crystal grain diameter of the outer peripheral surface is from 10 μm to 150 μm and the proportion of the area of the crystal grains having a crystal grain diameter more than double the average crystal grain diameter is less than 25% of the entire crystal area. Since the average crystal grain diameter of the outer peripheral surface of the cylindrical sputtering target material 10 is from 10 μm to 150 μm and the proportion of the area of the crystal grains having a crystal grain diameter more than double the average crystal grain diameter is less than 25% of the entire crystal area, it is possible to decrease the number of times of an abnormal electrical discharge occurring at the time of sputtering.

Hereinabove, the embodiment of the invention has been described, but the invention is not limited thereto, and the embodiments can be suitably changed within a range not departing from the technical ideas of the invention.

For example, in the embodiment, the conditions of the heat treatment Step S03 have been described as conditions in which the heat treatment temperature is from 400° C. to 900° C. and the maintaining time is from 15 minutes to 120 minutes, but there is no limitation, and the heat treatment conditions may be suitably set according to a composition and size of a cylindrical sputtering target material to be formed or a device which performs a heat treatment.

In addition, in the embodiment, pure copper such as oxygen-free copper, tough pitch copper, or 4N copper, or the copper alloy formed of a composition which contains one kind or two or more kinds selected from Mg, Al, Ag, Ti, Zr, Mn, Ca, Cr, Sn, Ni, Zn, Co, and P, and the balance of copper and inevitable impurities has been described as an example of the copper or the copper alloy configuring the cylindrical sputtering target material 10, but other copper or copper alloys may be a target. Particularly, the total content of one kind or two or more kinds selected from Mg, Al, Ag, Ti, Zr, Mn, Ca, Cr, Sn, Ni, Zn, Co, and P is desirably in a range of 0.001 mass % to 10 mass %.

EXAMPLES

Hereinafter, results of a confirmation test performed for confirming the effectiveness of the invention will be described.

First, a cylindrical ingot (outer diameter of 160 mm and inner diameter of 100 mm) formed of copper or a copper alloy having a composition shown in Table 1 was manufactured in a vertical continuous casting machine. A cylindrical sputtering target material was formed by repeatedly performing the cold working and the heat treatment with respect to the cylindrical ingot. Values of increased diameters in the cold working, a sectional area ratio before and after the working, and the heat treatment conditions are shown in Table 1. A cylindrical sputtering target was manufactured using the cylindrical sputtering target material.

The following evaluations were performed with respect to the obtained cylindrical ingot, the cylindrical sputtering target material, and the cylindrical sputtering target.

<Average Crystal Grain Diameter of Cylindrical Ingot>

The crystal structure of the outer peripheral surface of the cylindrical ingot was observed and the average crystal grain diameter thereof was measured. A measurement sample was cut, and an observation surface was polished and observed using an optical microscope. The number of crystal grains in an area having a size of 20 mm×20 mm was counted from the obtained crystal grain boundaries, a total length of the crystal grain boundaries in the area having a size of 20 mm×20 mm was divided by the number of crystal grains to calculate a crystal grain area, circle conversion of the crystal grain area was performed, and accordingly the average crystal grain diameter was acquired. Results of the measurement are shown in Table 1.

<Average Crystal Grain Diameter of Outer Peripheral Surface of Cylindrical Sputtering Target Material>

The crystal structure of the outer peripheral surface of the obtained cylindrical sputtering target material was observed and the average crystal grain diameter was calculated.

A measurement sample was cut, an observation surface was polished, and crystal grain boundaries were specified using an EBSD measurement device using a field-emission type scanning electron microscope (S4300-SE manufactured by Hitachi, Ltd. and OIM Data Collection manufactured by EDAX/TSL) and analysis software (OIM Data Analysis ver. 5.2 manufactured by EDAX/TSL). The measurement conditions were set so that the measurement range was 680 µm×1020 µm, the measurement step was 2.0 µm, and the operation time was set as 20 msec/point.

Specifically, an electronic beam was emitted to each measurement point (pixel) in the measurement range of the sample surface using the scanning electron microscope described above, and the measurement points of which an orientation difference between adjacent measurement points was equal to or greater than 15° were set as a crystal grain boundary by orientation analysis performed by a backscattered electron beam analysis method. The number of crystal grains in the observation area was counted from the obtained crystal grain boundaries, the total length of the crystal grain boundaries in the observation area was divided by the number of crystal grains to calculate a crystal grain area, circle conversion of the crystal grain area was performed, and accordingly the average crystal grain diameter was acquired. Results of the calculation are shown in Table 1.

<Proportion of Area of Crystal Grains with Greater Crystal Grain Diameter than Double Average Crystal Grain Diameter>

In addition, the crystal structure of the outer peripheral surface of the cylindrical sputtering target material was observed and the proportion of the area of the crystal grains having a crystal grain diameter more than double the average crystal grain diameter was calculated.

After calculating the average crystal grain diameter by the procedure described above, grain size distribution was acquired by the EBSD, the grain diameter which is equal to or greater than the average value was calculated, and the crystal grains having a crystal grain diameter more than double the average crystal grain diameter were specified. The crystal grain diameter of the specified crystal grains was calculated and the number thereof was counted to calculate the area of the crystal grains having a crystal grain diameter more than double the average crystal grain diameter. The proportion of the area of the crystal grains having a crystal grain diameter more than double the average crystal grain diameter was acquired by calculating the entire area by measuring the crystal grain diameter of all of the observed crystal grains and counting the number thereof. Results of the calculation are shown in Table 1.

<Sputtering Test>

A sputtering test was performed under the following conditions using the obtained cylindrical sputtering target and the number of times of an abnormal electrical discharge was counted using an arcing counter attached to a sputtering device. The sputtering test was performed under two conditions of "Ar gas" used when forming a wiring film and "mixed gas" used when forming an oxygen-containing film as atmosphere gas. Results of the evaluation are shown in Table 1.

Power: DC
Sputtering output: 600 W
Sputtering pressure: 0.2 Pa
Sputtering time: 8 hours
Peak vacuum degree: $4\times10^{-5}$ Pa
Atmosphere gas composition: Ar gas/mixed gas (90 vol % of Ar+10 vol % of O)

TABLE 1

| | | | Cylindrical ingot | Cold working | | | | Cylindrical sputtering target material | | Sputtering test | |
|---|---|---|---|---|---|---|---|---|---|---|---|
| | | | Average crystal grain diameter | Value of increased diameter | Sectional area ratio | Heat treatment | | Average crystal grain diameter | Proportion | Number of times of abnormal electrical discharge | |
| | | Composition | (µm) | (%) | (%) | Temperature (° C.) | Time (min) | (µm) | of area (%)* | Ar gas | Mixed gas |
| Examples of invention | 1 | Cu—1.0 mass % Ca | 15 | 2 | 9 | 800 | 60 | 87 | 18 | 0 | 1 |
| | 2 | Cu—5.3 mass % Mn | 0.1 | 10 | 5 | 650 | 90 | 13 | 19 | 0 | 1 |
| | 3 | Oxygen-free copper | 7 | 3 | −8 | 450 | 60 | 146 | 14 | 2 | 1 |
| | 4 | Cu—0.01 mass % Ag | 11 | 28 | 10 | 550 | 110 | 64 | 22 | 1 | 1 |
| | 5 | Oxygen-free copper | 18 | 16 | −3 | 450 | 20 | 105 | 2 | 0 | 1 |

TABLE 1-continued

| | | Cylindrical ingot | Cold working | | | Cylindrical sputtering target material | | Sputtering test | |
|---|---|---|---|---|---|---|---|---|---|
| | | Average crystal grain diameter | Value of increased diameter | Sectional area ratio | Heat treatment | | Average crystal grain diameter | Proportion | Number of times of abnormal electrical discharge |
| | Composition | (μm) | (%) | (%) | Temperature (°C.) | Time (min) | (μm) | of area (%)* | Ar gas / Mixed gas |
| Comparative Example | 1  Cu—1.0 mass % Ca | 3 | 14 | 14 | 800 | 150 | 300 | 54 | 49 / 110 |
| | 2  Oxygen-free copper | 98 | 0 | 3 | 920 | 60 | 120 | 49 | 10 / 18 |

*The proportion of the area of the crystal grains having a crystal grain diameter more than double the average crystal grain diameter As shown in Table 1, in Comparative Example 1, the average crystal grain diameter of the cylindrical sputtering target material and the proportion of the area of the crystal grains having a crystal grain diameter more than double the average crystal grain diameter are not in the range of the invention, and the number of times of abnormal electrical discharge was higher under any of the conditions of Ar gas and mixed gas.

In Comparative Example 2, in which the crystal grain diameter of the cylindrical ingot exceeded 20 mm, the average crystal grain diameter of the cylindrical sputtering target material was great, the proportion of the area of the crystal grains having a crystal grain diameter more than double the average crystal grain diameter was high, and the crystal grains were coarse and not uniform. In the sputtering test, the number of times of abnormal electrical discharge was higher under any of the conditions of Ar gas and mixed gas.

With respect to this, in Examples 1 to 5 in which the crystal grain diameters of the cylindrical ingot are equal to or smaller than 20 mm, the average crystal grain diameter of the cylindrical sputtering target material was in a range of 10 μm to 150 μm, the proportion of the area of the crystal grains having a crystal grain diameter more than double the average crystal grain diameter was also less than 25%, and the crystal grains were comparatively fine and uniform. In the sputtering test, it was confirmed that the number of times of an abnormal electrical discharge can be decreased under any of the conditions of Ar gas and mixed gas and that sputtering can be stably executed.

INDUSTRIAL APPLICABILITY

According to the manufacturing method of the cylindrical sputtering target material of the invention, it is possible to efficiently manufacture a cylindrical sputtering target material formed of copper or a copper alloy at low cost and uniformly miniaturize crystal grain diameters of an outer peripheral surface.

REFERENCE SIGNS LIST

10 CYLINDRICAL SPUTTERING TARGET MATERIAL
11 OUTER PERIPHERAL SURFACE
S01 CONTINUOUS CASTING STEP
S02 COLD WORKING STEP
S03 HEAT TREATMENT STEP

The invention claimed is:

1. A manufacturing method of a tube-shaped sputtering target material formed of copper or a copper alloy, the method comprising:
   a continuous casting step of casting a tube-shaped ingot having an average crystal grain diameter of 0.01 to 20 mm using a continuous casting machine or a semi-continuous casting machine; and
   a cold working step and a heat treatment step of repeatedly performing cold working and a heat treatment with respect to the tube-shaped ingot or a tube-shaped worked material obtained by working the tube-shaped ingot, to form the tube-shaped sputtering target material in which an average crystal grain diameter of an outer peripheral surface is from 10 μm to 150 μm and a proportion of the area of crystal grains having a crystal grain diameter more than double the average crystal grain diameter is less than 25% of the entire crystal area,
   wherein a tube expansion step is performed at least once as the cold working step, said tube expansion step increasing an outer diameter of the tube-shaped ingot or the tube-shaped worked material in a range exceeding 0% and equal to or smaller than 30% and changing a cross sectional area after the cold working to be in a range of −10% to +10% of a cross sectional area before the cold working,
   the method does not include a hot working step for forming the ingot,
   a casting speed of the continuous casting step is set so that a cooling speed of the ingot is equal to or higher than 100° C./min, and
   a heat treatment temperature is from 400° C. to 900° C. and the maintaining time in the range of the heat treatment temperature is in a range of 15 minutes to 120 minutes in the heat treatment step.

2. The manufacturing method of a tube-shaped sputtering target material according to claim 1,
   wherein the tube-shaped sputtering target material has an outer diameter D thereof is in a range satisfying a relationship of 140 mm≤D≤180 mm, an inner diameter d thereof is in a range satisfying a relationship of 110 mm≤d≤135 mm, and a length L thereof is in a range satisfying a relationship of 1000 mm≤L≤4000 mm.

3. The manufacturing method of a tube-shaped sputtering target material according to claim 1, wherein
   the tube-shaped sputtering target material is configured with either pure copper selected from the group consisting of oxygen-free copper, tough pitch copper and 4N copper, or a copper alloy containing one kind or two or more kinds selected from Mg, Al, Ag, Ti, Zr, Mn, Ca, Cr, Sn, Ni, Zn, Co, and P, and the total content of one kind or two or more kinds selected from Mg, Al, Ag, Ti, Zr, Mn, Ca, Cr, Sn, Ni, Zn, Co, and P is in a range of 0.001 mass % to 10 mass %.

4. The manufacturing method of a tube-shaped sputtering target material according to claim 1, wherein the copper alloy is configured with a Cu-0.002 mass % to 2 mass % Mg alloy, a Cu-0.001 mass % to 10 mass % Al alloy, a Cu-0.001 mass % to 10 mass % Mn alloy, a Cu-0.05 mass % to 4 mass % Ca alloy and a Cu-0.01 mass % to 10 mass % Ag alloy.

5. The manufacturing method of a tube-shaped sputtering target material according to claim 1, wherein the tube-shaped ingot having the average crystal grain diameter of 7 to 20 mm is casted in the continuous casting step.

* * * * *